(12) United States Patent
Bateman et al.

(10) Patent No.: US 8,372,737 B1
(45) Date of Patent: Feb. 12, 2013

(54) USE OF A SHADOW MASK AND A SOFT MASK FOR ALIGNED IMPLANTS IN SOLAR CELLS

(75) Inventors: Nicholas P. T. Bateman, Reading, MA (US); Benjamin B. Riordon, Newburyport, MA (US); Atul Gupta, Beverly, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/170,792

(22) Filed: Jun. 28, 2011

(51) Int. Cl.
*H01L 21/425* (2006.01)

(52) U.S. Cl. .................. 438/527; 438/531; 257/E21.148

(58) Field of Classification Search .................. 438/519, 438/531, 914, 944; 257/E21.057, E21.058, 257/E21.059, E21.146, E21.148, E21.247, 257/E21.331
See application file for complete search history.

(56) References Cited

U.S. PATENT DOCUMENTS

| | | |
|---|---|---|
| 2011/0104618 A1 | 5/2011 | Bateman et al. |
| 2011/0180131 A1* | 7/2011 | Mullin et al. .................. 136/256 |
| 2011/0237022 A1 | 9/2011 | Bateman et al. |

* cited by examiner

*Primary Examiner* — Cheung Lee

(57) ABSTRACT

An improved method of implanting a solar cell is disclosed. A substrate is coated with a soft mask material. A shadow mask is used to perform a pattern ion implant and to set the soft mask material. After the soft mask material is set, the mask is removed and a blanket implant is performed.

21 Claims, 7 Drawing Sheets

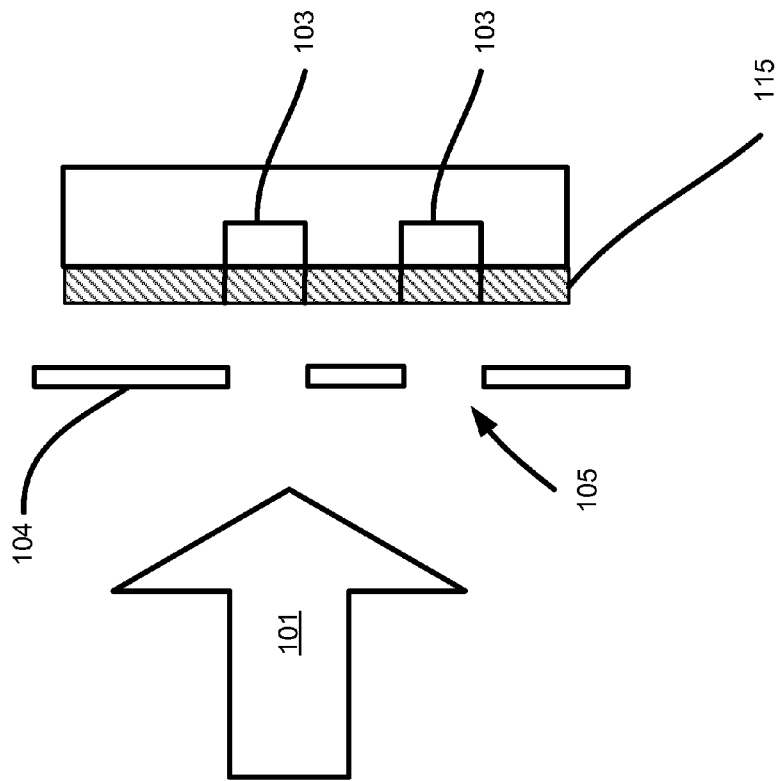
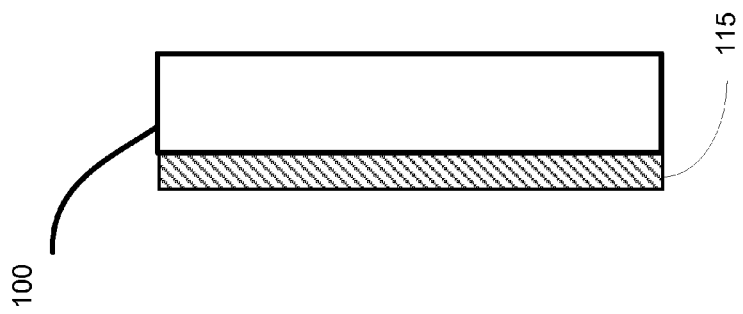
FIG. 7B
FIG. 7A

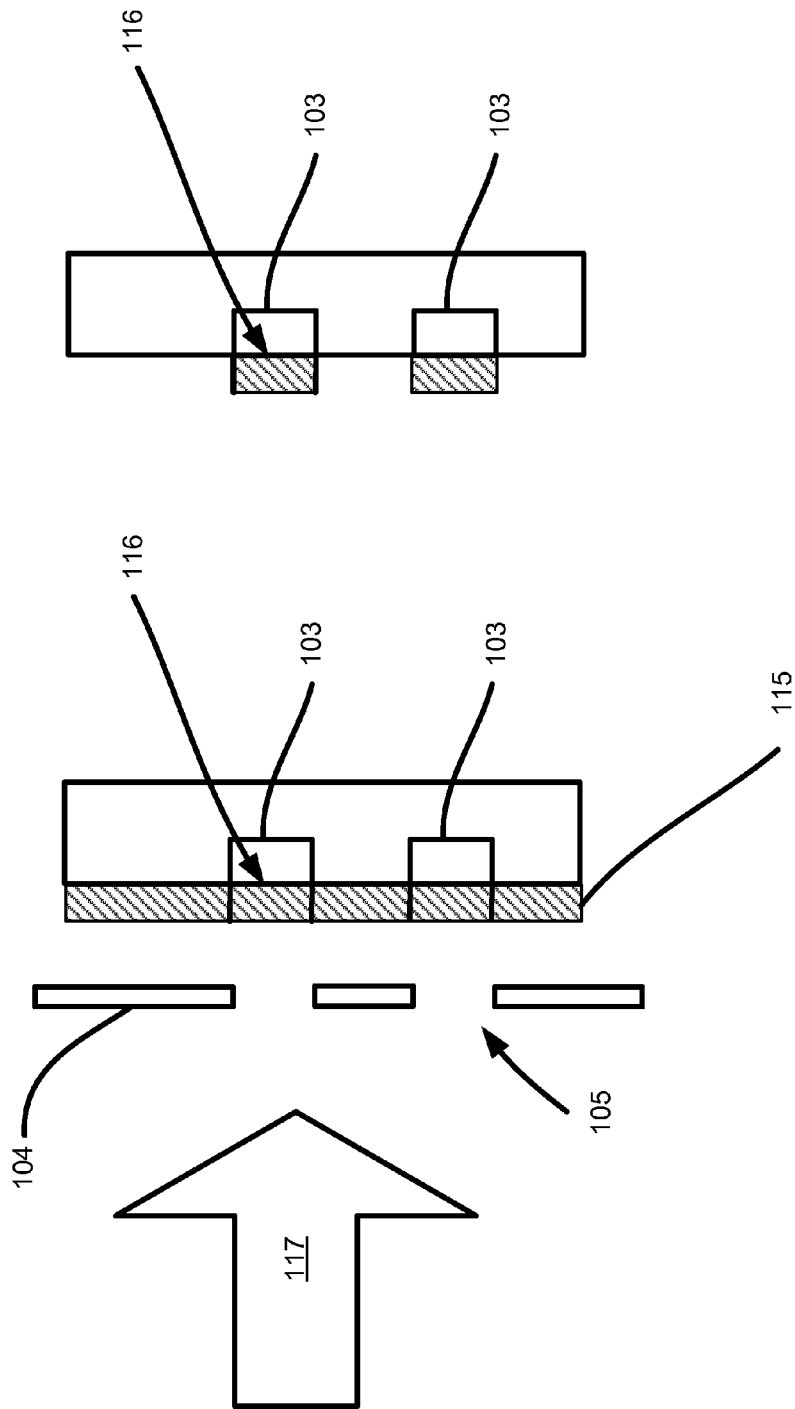

USE OF A SHADOW MASK AND A SOFT MASK FOR ALIGNED IMPLANTS IN SOLAR CELLS

BACKGROUND

Ion implantation is a standard technique for introducing conductivity-altering impurities into substrates. A desired impurity material is ionized in an ion source, the ions are accelerated to form an ion beam of prescribed energy, and the ion beam is directed at the surface of the substrate. The energetic ions in the beam penetrate into the bulk of the substrate material and are embedded into the crystalline lattice of the substrate material to form a region of desired conductivity.

Solar cells provide pollution-free, equal-access energy using a free natural resource. Due to environmental concerns and rising energy costs, solar cells, which may be composed of silicon substrates, are becoming more globally important. Any reduced cost to the manufacture or production of high-performance solar cells or any efficiency improvement to high-performance solar cells would have a positive impact on the implementation of solar cells worldwide. This will enable the wider availability of this clean energy technology.

Solar cells may require doping to improve efficiency. The dopant may be, for example, arsenic, phosphorus, or boron. FIG. 1A is a cross-sectional view of an interdigitated back contact (IBC) solar cell. In the IBC solar cell, the p-n junction is on the back side of the solar cell. As shown in FIG. 1B, the doping pattern includes alternating p-type and n-type dopant regions in this particular embodiment. The p+ emitter 203 and the n+ back surface field 204 are appropriately doped. This doping may enable the junction in the IBC solar cell to function or have increased efficiency.

Some solar cells, such as IBC solar cells, require that different regions of the solar cell be p-type and others n-type. It may be difficult to align these various regions without overlap or error. For example, the p+ emitter 203 and n+ back surface field 204 in FIG. 1B must be doped. If overlap between the p-type regions 203 and the n-type regions 204 exists, counterdoping may occur. Any overlap or misalignment also may affect the function of the solar cell. For solar cells that require multiple implants, particularly those with small structure or implant region dimensions, the alignment requirements can limit the use of a shadow mask or proximity mask. In particular, as shown in FIG. 1B, an IBC solar cell requires alternating lines doped with, for example, B and P. Therefore, any shadow mask or proximity mask for the B implant has narrow, long apertures that are carefully aligned to the small features that were implanted with P using a different proximity mask or shadow mask.

Accordingly, there is a need in the art for an improved method of implanting a solar cell and, more particularly, a method of using a shadow mask to create a soft mask that can be used for subsequent implants.

SUMMARY

An improved method of implanting a solar cell is disclosed. A substrate is coated with a soft mask material. A shadow mask is used to perform a pattern ion implant and to set the soft mask material. After the soft mask material is set, the mask is removed and a blanket implant is performed.

BRIEF DESCRIPTION OF THE DRAWINGS

For a better understanding of the present disclosure, reference is made to the accompanying drawings, which are incorporated herein by reference and in which:

FIGS. 7A-E is a cross-section view of the steps of FIG. 4.

DETAILED DESCRIPTION

Embodiments of this system are described herein in connection with solar cells. However, the embodiments of this system can be used with, for example, semiconductor wafers or flat panels. The implanter may be, for example, a beamline or plasma doping ion implanter. Thus, the invention is not limited to the specific embodiments described below.

Figure 1A:
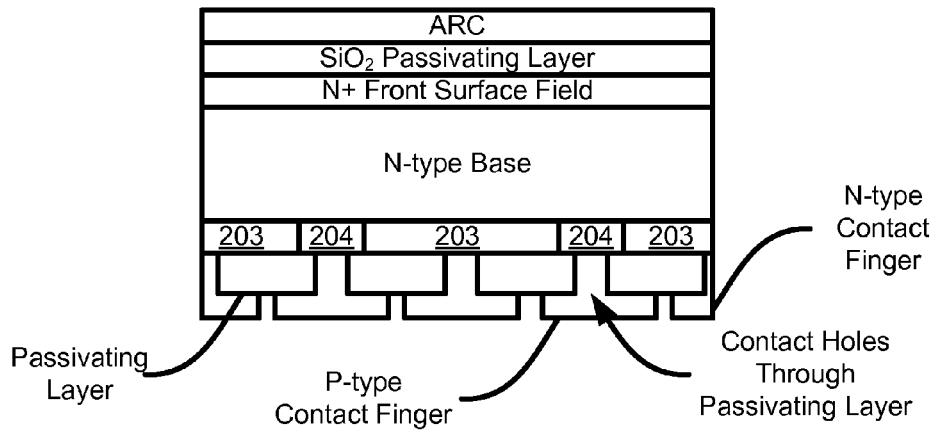
FIG. 1A is a cross-sectional view of an interdigitated back contact solar cell.
Figure 1B:
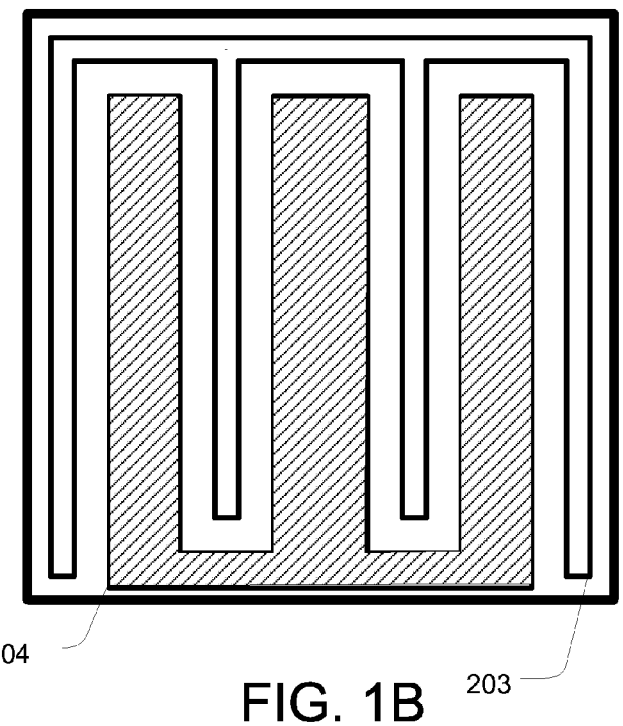
FIG. 1B is a bottom view of an interdigitated back contact solar cell.
Figure 2:
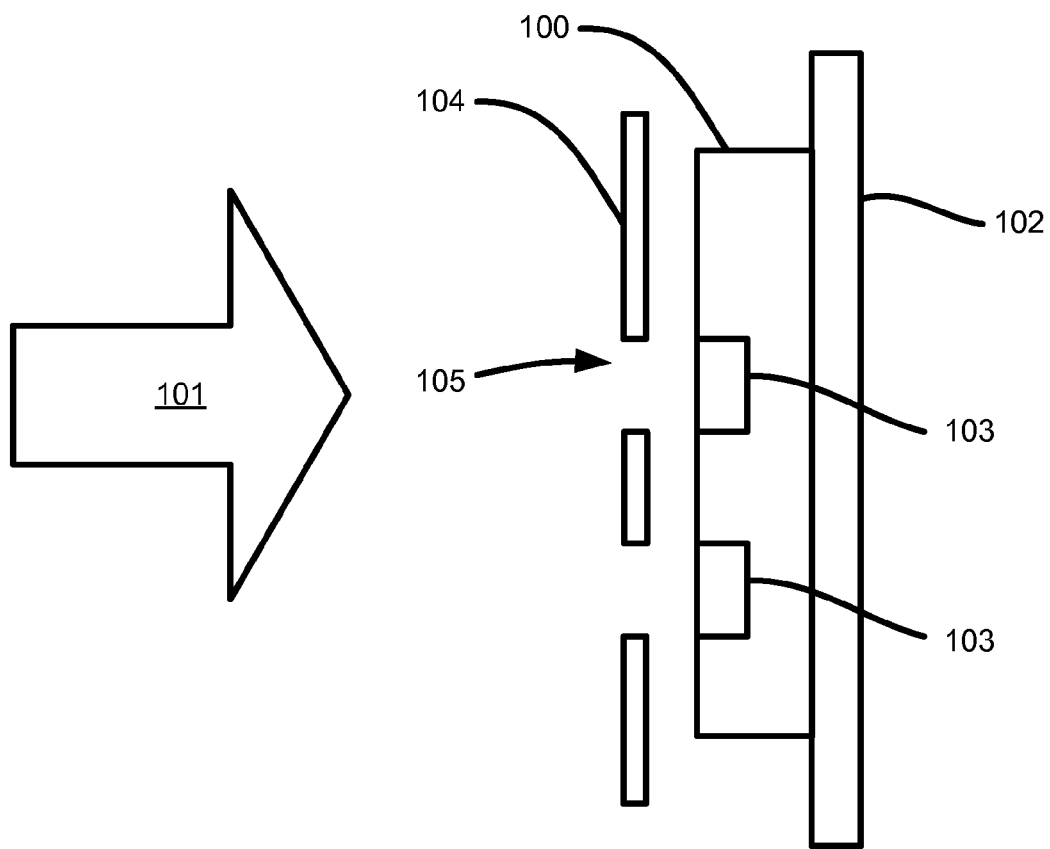
FIG. 2 is a cross-sectional view of implantation through a mask.

FIG. 2 is a cross-sectional view of implantation through a mask. When a specific pattern of ion implantation in a substrate 100 is desired, a mask 104 may be used. This mask 104 may be a shadow or proximity mask. The mask 104 is placed in front of a substrate 100 in the path of an ion beam 101. The substrate 100 may be, for example, a solar cell. The substrate 100 may be placed on a platen 102, which may use electrostatic or physical force to retain the substrate 100. The mask 104 has apertures 105 that correspond to the desired pattern of ion implantation in the substrate 100. The apertures 105 may be stripes, dots, or other shapes. The implant into the solar cell 100 passes through the apertures 105 in the mask 104. Thus, only the implanted regions 103 are formed. The implanted regions 103 may correspond to, for example, the p+ emitter 203 in the IBC solar cell of FIG. 1. The implanted region 103 may become amorphized due to the implant, while the rest of the solar cell 100 remains as crystalline silicon. Use of the mask 104 eliminates process steps, such as silkscreening or lithography, required for other ion implantation techniques. As disclosed in the embodiments herein, a later implant may implant either the implanted region 301 or some other region of the solar cell 300.

Figure 3:
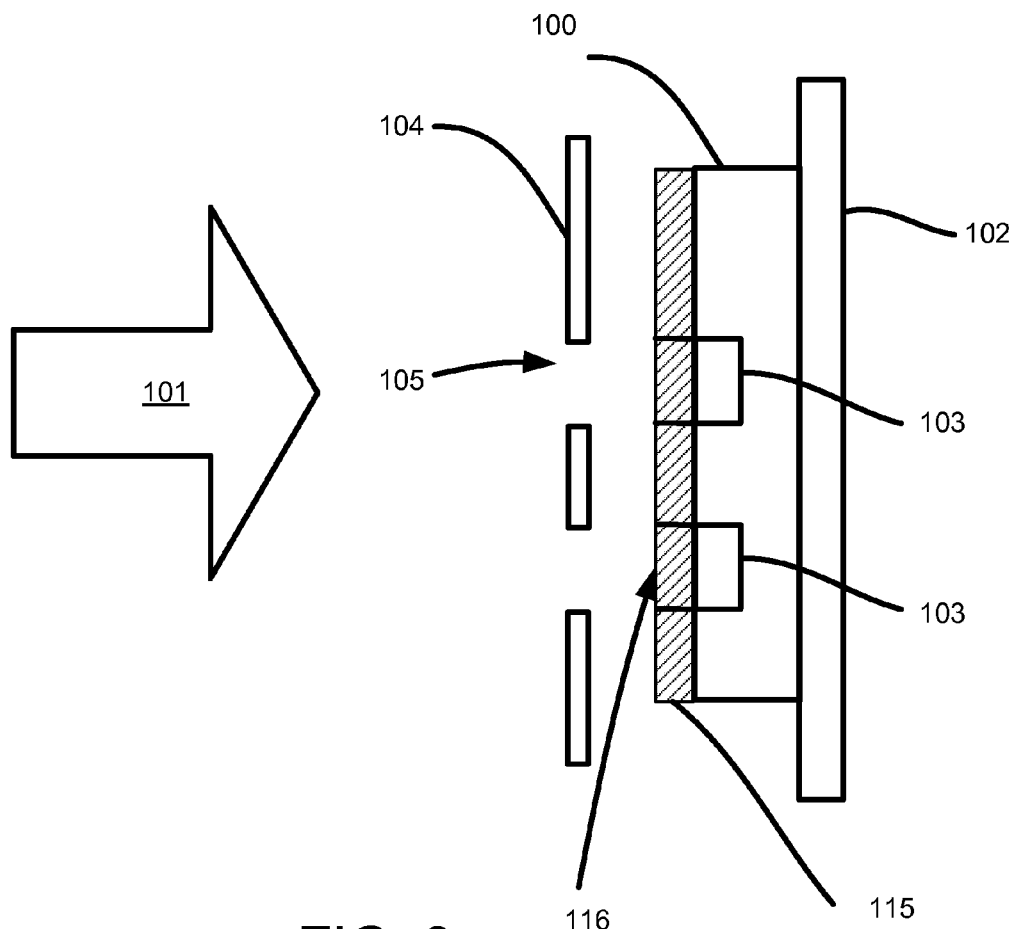
FIG. 3 is a cross-sectional view of implantation through a mask using a soft mask.

For solar cell structures that require multiple implants, the first implant, such as that described in FIG. 2, may be used to create a mask for subsequent implants. Referring to FIG. 2, regions 103 are implanted with ions due to their exposure to the ion beam 101. FIG. 3 shows the introduction of a soft mask layer 115 between the shadow mask 104 and the solar cell 100. This mask layer 115 is exposed in some portions 116 to the ion beam 101 through apertures 105. The rest of the soft mask 115 is not exposed to the beam. In other embodiments, rather than an ion beam, a light source, such as UV light, is passed through the shadow mask 104 to set portions of the soft mask 115. In another embodiment, an electron beam rather than an ion beam can be used to set portions of the soft mask 115. This configuration can be advantageously used to create self-aligned adjacent implanted regions relatively inexpensively.

Figure 4:
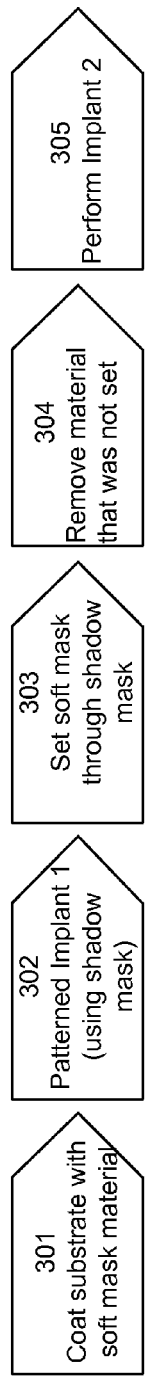
FIG. 4 is a flowchart of a first solar cell manufacturing process.

In a first embodiment, shown in FIG. 4, a soft mask material 115 is applied to the substrate in step 301. This material may be of various compositions. For example, photoresist, which changes properties as a result of ultraviolet radiation, may be used. Such photoresist materials are well known in the art. In another embodiment, the soft mask may be replaced with a polymer which is set by high energy radiation. Radiation setting polymers, such as polyketones, are well known and are disclosed, for example, in U.S. Pat. No. 5,705,539. Thus, rather than using a setting process which includes application of UV light, the setting process includes the introduction of ions and/or associated implant damage to the polymer using the shadow mask 104. In other embodiments, a thermally sensitive polymer may be used. These thermally sensitive polymers may be set by the application of infrared light, implanted ions, electron beam, lasers or other processes that heat the polymer through the shadow mask. The processes below are relevant to all of these types of soft mask material.

A shadow mask 104 is then placed in front of the substrate 100, and a first patterned implant is performed in step 302. If the soft mask material is a polymer, this implant is performed at an energy level sufficiently high so as to pass through the polymer without changing its characteristics. In some embodiments that use a polymer as the soft mask material, the species of ions used for this first patterned implant are of low mass, further enabling their ability to pass through the polymer.

As shown in step 303, a setting process is performed after this implant has been performed. In the case where photoresist is used as the soft mask material, ultraviolet, laser may be used to set the soft mask material 115. This light source is passed through the shadow mask 104, so as only to expose the soft mask in the regions 116 where the implant (step 302) was performed. In one embodiment, this setting process (step 303) hardens the material which is positioned over the previously implanted regions. In another embodiment, the soft mask 115 that is not exposed to the setting process hardens on the substrate.

In the case where a radiation set polymer is used as the soft mask material, after this implant has been performed, the setting process may be a second patterned implant, which is performed to set the soft mask 115. In one embodiment, the same species of ions are used for the setting process (step 303), except different, typically lower, energy levels are used. For example, although specific energies depend on the species and polymers used, the lower energy implant may be performed at 10-40 keV, while the higher energy implant is performed at 80-300 keV. In other embodiments, a different species, such as one having greater mass so as not to penetrate the soft mask material 115, is used. For example, boron or phosphorus may be used for the first implant, while higher mass elements, such as xenon or krypton are used for the setting implant. These ions are passed through the shadow mask 104, so as only to expose the polymer in the regions 116 where the first patterned implant (step 302) was performed. In one embodiment, this setting process (step 303) hardens and retains the material over the previously implanted regions. In another embodiment, the soft mask that is not exposed to the setting process hardens and remains on the substrate. In another embodiment, the angle at which the first patterned implant (step 302) is incident upon the substrate is different than the angle of incidence of the second patterned implant used as the setting process (step 303). For example, the first patterned implant may be performed perpendicular to the substrate (i.e. 90°), while the second patterned implant may be at an angle less than 90°. The change in incident angle may allow the first patterned implant to pass through the material 115, but not allow the second patterned implant to penetrate the material 115.

In either case, the material that was not set is removed, as shown in step 304. Methods of removing a soft mask from a substrate are well known. In addition, the shadow mask 104 is removed from the path of the ions at this time as well. A second implant is then performed, where those portions of the substrate 100 that are not covered by the soft mask are implanted, as shown in step 305. The species and the implant energy are selected such that the implant does not pass through the retained soft mask 115. In some embodiments, this implant may use ions of higher mass, or lower implant energy. In one embodiment, this second implant (step 305) penetrates the portion of the substrate 100 that was not implanted by the patterned implant (step 302), thereby being a complementary implant. In other words, all portions of the substrate are implanted exactly once, either by the patterned implant (step 302) or the second implant (step 305).

Figure 5:
FIG. 5 is a flowchart of a second solar cell manufacturing process.

In another embodiment, shown in FIG. 5, the setting process (step 313) is performed prior to the patterned implant (step 312). As in the previous embodiment, the substrate 100 is coated with soft mask material 115 (step 311). A portion of the material 115 is then set using a setting process that utilizes the shadow mask 104 (step 313). Any of the techniques described above may be used. In some embodiments, the material 115 that is not exposed to the setting process hardens, while in other embodiments, the material 115 exposed to the setting process hardens. After the soft mask is set, the patterned implant (step 312) is performed using the shadow mask 104, where the ions pass through the exposed material 116, which may or not may be set. In the case where the exposed material 116 is set, the species, incident angle and implant energies are selected to penetrate the hardened material. In the case where the exposed material 116 is not set, the species, incident angle and implant energy are selected so as not to cause the exposed material 116 to set. After the patterned implant is completed, the material that was not set is removed (step 314), and the second implant is performed (step 315). As described above, the species, incident angle and the implant energy are selected such that the implant does not pass through the retained soft mask 115. In some embodiments, this implant may use ions of higher mass, a different incident angle or lower implant energy. This process may be performed using a soft mask material 115 that may be photoresist or a polymer, as described in conjunction with FIG. 4. The setting process (step 313) varies depending on the type of soft mask material 115 used.

Figure 6:
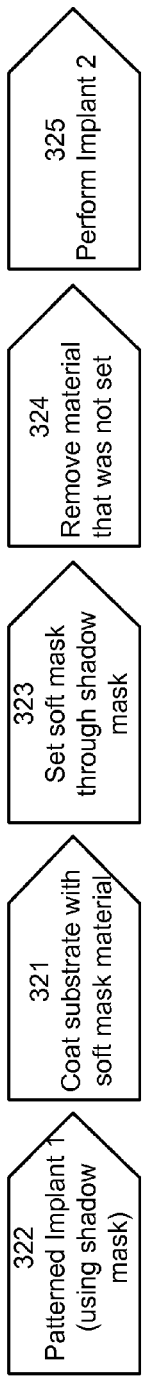
FIG. 6 is a flowchart of a third solar cell manufacturing process.

In another embodiment, shown in FIG. 6, the patterned implant (step 322) is performed before the substrate 100 is coated (step 321). This method may require an integrated wafer carrier and mask, such that the implant and coating can both be performed without modifying the relationship between the shadow mask 104 and the substrate 101 is unchanged. In other words, in this embodiment, the shadow mask 104 is placed in a known relation to the substrate 100 and a patterned implant (step 322) is performed. Since the soft mask material 115 has not yet been applied, there are no limitations placed on the type, energy, incident angle or current of the patterned implant. Furthermore, this patterned implant does not need to pass through the soft mask material 115.

After the patterned implant is performed (step 322), the substrate 100 is coated with the soft mask material 115 (step 321), without changing the relation between the shadow mask and the substrate. In one embodiment, this is done with an integrated wafer carrier and mask, such that the mask remains in place as the substrate is being coated. In some embodiments, the use of an integrated carrier allows the patterned implant and the soft mask exposure to be performed in separate environments. After the substrate 100 is coated, a portion of the material is set by performing a setting process through the shadow mask 104 (step 323). Any of the techniques described above can be used. The material that was not set is removed, as shown in step 324. In addition, the shadow mask 104 is removed at this time as well. A second implant is then performed, where those portions of the substrate 100 that are not covered by the soft mask are implanted, as shown in step 325. This process may be performed using a soft mask material 115 that may be photoresist or a polymer, as described in conjunction with FIG. 4. The setting process (step 323) varies depending on the type of soft mask material 115 used.

Figure 7E:
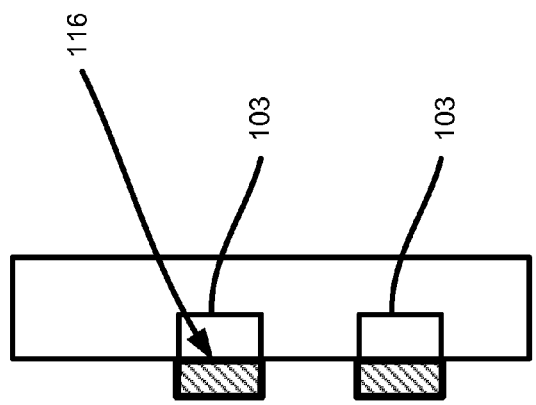
Figure 7E:
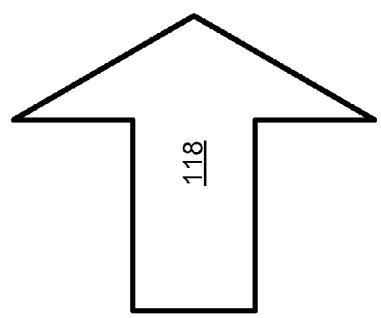

FIGS. 7A-E shows the various process steps of FIG. 4. FIG. 7A shows the soft mask material 115 applied to the substrate 100, as shown in step 301. FIG. 7B shows a patterned implant being performed after soft mask material has been applied to the substrate 100, as performed in steps 302, 312. Ions 101 pass through the shadow mask 104 via apertures 105, and create implanted regions 103 in the substrate 100. As described above, this patterned implant is performed at a set of operating parameters so as not to cause the soft material 115 to set. In FIG. 7C, a setting process 117, such as UV light (for a photoresist), or ion implantation, infrared light, or electron beam (for a polymer), is performed through the mask 104. This creates exposed portions 116 of the soft mask material 115. As described above, in some embodiments, these exposed portions 116 become set, while in other embodiments, the exposed portions 116 are not set by the setting process 117. FIG. 7D assumes that the exposed portions 116 are set by the setting process 117. The remainder of the soft mask material 115 is then removed, leaving the soft mask 115 only in the exposed portions 116. FIG. 7E shows a second implant 118 being performed, where the mask 104 has been removed. Therefore, the second implant 118 is a blanket implant. As described above, the species, incident angle and the implant energy are selected such that the implant does not pass through the retained soft mask 115. Therefore, the blanket implant 118 only implants those regions which are not covered by soft mask 115.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of performing a patterned implant in a substrate, comprising:
    coating said substrate with a soft mask material;
    performing a first patterned ion implant having ions of a first species and a first implant energy using a shadow mask, wherein said first patterned ion implant is configured to pass through said soft mask material without affecting its properties and implant ions into a first portion of a substrate;
    exposing said substrate to a setting process through said shadow mask, so as to cause regions of said soft mask material to set on said substrate;
    removing said soft mask material which is not set by said setting process;
    removing said shadow mask; and
    performing a blanket ion implant, wherein ions of said blanket implant do not pass through said soft mask material remaining on said substrate.

2. The method of claim 1, wherein said soft mask material comprises a photoresist, and said setting process comprises exposing said substrate to ultraviolet light.

3. The method of claim 1, wherein said soft mask material comprises a polymer sensitive to radiation, and said setting process comprises exposing said substrate to a second patterned ion implant process, having ions of a third species and a third implant energy.

4. The method of claim 3, wherein first implant energy is greater than said third implant energy.

5. The method of claim 3, wherein a mass of said first species is less than a mass of said third species.

6. The method of claim 3, wherein an angle that said first species is incident upon said substrate is different than an angle of incidence of said third species.

7. The method of claim 1, wherein said soft mask material comprises a thermally sensitive polymer and said setting process comprises exposing said substrate to infrared light, implanted ions, electron beam, laser or another process that heats said polymer through said shadow mask.

8. The method of claim 1, wherein said region of said soft mask material which is set on said substrate comprises a portion of said soft mask material exposed to said setting process.

9. The method of claim 1, wherein said region of said soft mask material which is set on said substrate comprises a portion of said soft mask material not exposed to said setting process.

10. The method of claim 1, wherein said setting process is performed prior to said first patterned ion implant.

11. The method of claim 1, wherein said setting process is performed after said first patterned ion implant.

12. The method of claim 1, wherein said blanket ion implant comprises ions of a second species and a second implant energy, and wherein a mass of said second species is greater than a mass of said first species.

13. The method of claim 1, wherein said blanket ion implant comprises ions of a second species and a second implant energy, and wherein said first implant energy is greater than said second implant energy.

14. The method of claim 1, wherein said blanket ion implant comprises ions of a second species and a second implant energy, and wherein an angle that said first species is incident upon said substrate is different than an angle of incidence of said second species.

15. A method of performing a patterned implant in a substrate, comprising:
    performing a first patterned ion implant having ions of a first species and a first implant energy using a shadow mask, wherein said first patterned ion implant is configured to implant ions into a first portion of a substrate;
    coating said substrate with a soft mask material while maintaining the relationship between said shadow mask and said substrate;
    exposing said substrate to a setting process through said shadow mask, so as to cause regions of said soft mask material to set on said substrate;
    removing said soft mask material which is not set by said setting process;
    removing said shadow mask; and performing a blanket ion implant, wherein ions of said blanket implant do not pass through soft mask material remaining on said substrate.

16. The method of claim 15, wherein said soft mask material comprises a photoresist, and said setting process comprising exposing said substrate to ultraviolet light.

17. The method of claim 15, wherein said soft mask material comprises a polymer sensitive to radiation, and said setting process comprises exposing said substrate to a second patterned ion implant process, having ions of a second species and a energy.

18. The method of claim 15, wherein said soft mask material comprises a thermally sensitive polymer and said setting process comprises exposing said substrate to infrared light, implanted ions, electron beam, laser or another process that heats said polymer through said shadow mask.

19. The method of claim 15, wherein said region of said soft mask material which is set on said substrate comprises a portion of said soft mask material exposed to said setting process.

20. The method of claim 15, wherein said region of said soft mask material which is set on said substrate comprises a portion of said soft mask material not exposed to said setting process.

21. The method of claim 15, wherein said substrate and said shadow mask maintain their relationship through a use of an integrated substrate carrier and mask.

* * * * *